United States Patent [19]

Taylor

[11] 4,236,231
[45] Nov. 25, 1980

[54] PROGRAMMABLE THRESHOLD SWITCHABLE RESISTIVE MEMORY CELL ARRAY

[75] Inventor: David L. Taylor, Carrollton, Tex.
[73] Assignee: Harris Corporation, Melbourne, Fla.
[21] Appl. No.: 82,505
[22] Filed: Oct. 9, 1979
[51] Int. Cl.³ .............................................. G11C 11/34
[52] U.S. Cl. .................................. 365/163; 365/205
[58] Field of Search ............... 365/163, 184, 185, 205, 365/207

[56] References Cited

U.S. PATENT DOCUMENTS

| | | | |
|---|---|---|---|
| 3,579,204 | 5/1971 | Lincoln | 365/184 |
| 3,699,543 | 10/1972 | Neale | 365/163 |
| 4,139,911 | 2/1979 | Sciulli et al. | 365/184 |
| 4,180,866 | 12/1979 | Shanks | 365/186 |

Primary Examiner—Stuart N. Hecker
Attorney, Agent, or Firm—Leitner, Palan, Lyman, Martin & Bernstein

[57] ABSTRACT

A memory array wherein each memory cell includes a pair of threshold resistive elements which switch from a high to a low resistance state when a potential above their respective programmable thresholds is applied. A binary value is stored by creating a threshold difference between the two resistive elements using two different value current sources. The binary value stored is read by applying a ramp potential and determining which threshold resistive element switched states first using a sense latch.

11 Claims, 1 Drawing Figure

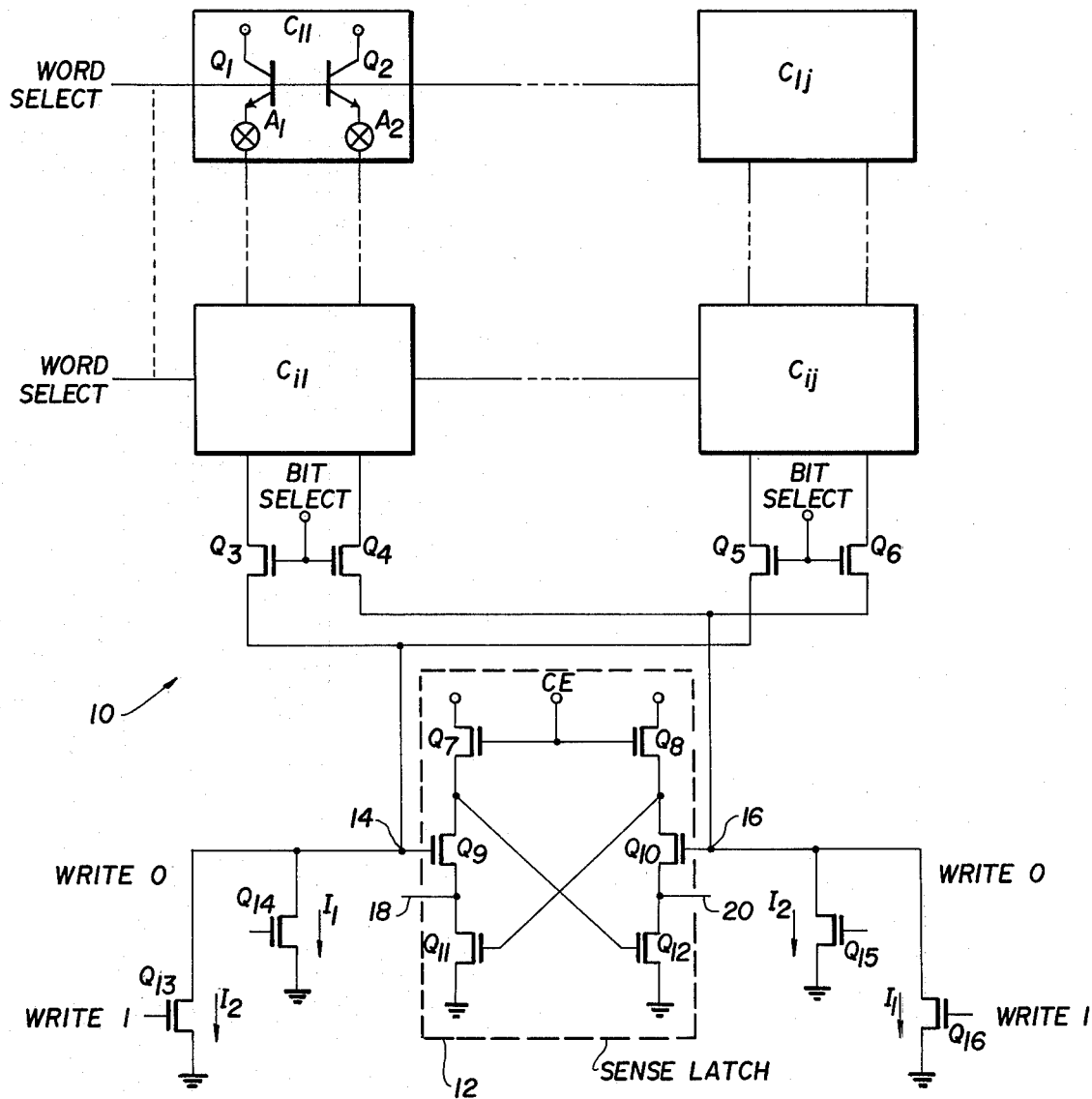

PROGRAMMABLE THRESHOLD SWITCHABLE RESISTIVE MEMORY CELL ARRAY

BACKGROUND OF THE INVENTION

The present invention relates generally to memory arrays and more specifically to a memory array including programmable threshold, switchable resistive devices.

Extensive research has been undertaken to make use of amorphous semiconductor devices as memory cells. The time generally required to establish a low resistance state of an amorphous memory is of the order of a few milliseconds. Thus, amorphous memory cells have generally been slow write and are considered to be electrically alterable read only memories (EAROM). An example of such an array using bistable switchable resistors is U.S. Pat. No. 3,761,896 to Davidson wherein Ovonic devices are suggested. In this patent, the memory device is switched from a high impedance stable non-volatile state to a low impedance nonvolatile state.

To either decrease or improve the write and read time of amorphous chalcogenide memory devices, the threshold value of the high resistance state is used to represent the two logic states. As described in U.S. application Ser. No. 906,381 filed May 16, 1978 to Ronald G Neale, titled "Amorphous Non-Volitile RAM" assigned to the common assignee of the present invention, a first logic state of the memory is represented by a high resistance state of the first threshold level and a second logic state is represented by a high resistance state of a second threshold level lower than the first threshold level. In either logic state, the amorphous device has substantially no crystal structure or a microcrystal structure insufficient to create the high conductivity state. A fast write nonvolatile RAM is produced with a write time of under one microsecond.

The logic state of the amorphous memory cell in Neale is read by monitoring the electrical characteristics; namely, current through or voltage across the cell for a constant read pulse. The read pulse has a duration greater than the duration required for conduction by switching of said second logic state at said read voltage amplitude and is of duration less than necessary to ensure conduction by switching first logic state at said read voltage. The monitoring occurs in the time period after the duration for conduction of said second logic sate at the read voltage.

To use the method described in the co-pending Neale application, it is important to know the threshold value for the zero and the one state to select a read pulse of an appropriate voltage amplitude and duration so as to distinguish the two logic states. The threshold voltage of the amorphous memory device may change with time and temperature as well as the history of the device, namely the number of read, write and erase cycles. Thus, there is needed a method for reading amorphous memory devices which is insensitive to actual threshold voltage levels. It would also be advantageous to have a memory array with internal circuity such that standard memory array addressing techniques can be used to address the memory cells and monitor the output.

The problem of sensing the threshold of a variable threshold device in a memory array was addressed in U.S. Pat. No. 3,579,204 to Lincoln. The memory array used electrically alterable, variable threshold field effect transistors. Instead of applying an interrogation voltage intermediate the binary valued conduction threshold of the high and low logic state and monitoring the magnitude of the resulting current, Lincoln suggested providing two variable threshold transistors in each cell, storing a binary bit by establishing a difference in threshold between the two transistors, and reading the cell by sensing the difference in current flow therebetween in response to an interrogation potential which exceeds the threshold of both possible logic states. The difference in current is directly related to the difference of threshold relative to the interrogation of potential. Thus, by having the interrogation potential exceeding the threshold of both logic states, the current through the two devices may be compared to determine which logic state of the cell. This method is not compatible with amorphous memory devices in that once the threshold of an amorphous memory device is exceeded, the device switches to a low resistance state providing a fixed current irrespective of its original threshold. Thus, there exists a need for a method of reading amorphous memory arrays which is insensitive to actual thresholds.

SUMMARY OF THE INVENTION

The present invention overcomes the problems of the prior art by providing a circuitry and scheme specifically designed to measure the stored logic state in an amorphous memory cell which is insensitive to threshold variations. The scheme and circuitry are easily adaptable to other programmable threshold devices. Each memory cell includes a pair of programmable threshold, switchable resistive elements which switch from a high resistive state to a low resistive state when a potential above their respective thresholds is applied.

The thresholds of the resistive elements of a pair are programmed to be of different values. A logic one state is represented by one of the thresholds being higher than the other threshold. The logic zero state is represented by the one threshold being lower than the other threshold. When the programmable threshold, switchable resistive elements are amorphous elements, the thresholds are programmed by applying a first current to one of the amorphous elements to define a low threshold and applying a substantially higher current to the other amorphous element to reset or assure that the element has a high threshold state. Each cell is connected in an array having a word line per cell and a pair of bit lines per cell wherein the pair of threshold, switchable resistive elements are each connected to their own bit line per cell. The pair of bit lines are used for programming the thresholds as well as sensing the logic state of the cell.

The read operation is performed by applying a ramp potential across the selected cell and monitoring the pair of bit lines to determine which programmable threshold, switchable resistive device switches first. A bistable sense latch connected between the pair of bit lines detects which element has switched first to provide an appropriate logic output. While the sense latch and the current sources are formed from insulated gate field effect transistors, a bipolar transistor in an emitter follower configuration connects the amorphous element to the word select line. Although the present scheme was designed for amorphous memory elements, it may be used with other variable threshold devices which switch from a high to a low resistance state.

An object of the present invention is to provide a memory scheme having a fast read and write to qualify as a RAM using amorphous devices.

Another object of the invention is to provide an amorphous RAM array which is insensitive to threshold variations of the amorphous device.

A further object of the present invention is to provide the scheme which is applicable to any variable threshold, switchable resistive cell device.

Other objects, advantages and novel features of the invention will become apparent from the following detailed description of the invention when considered in conjunction with accompanying drawing.

BRIEF DESCRIPTION OF THE DRAWING

The FIGURE is a schematic of a memory array incorporating the principles of the present invention.

DESCRIPTION OF THE PREFERRED EMBODIMENTS

The FIGURE illustrates a memory array having a plurality of cells C interconnected by word select lines, one per row and a plurality of bit lines, two per column. Each bit select line is connected to a pair of insulated gate field effect transistors for example Q3 and Q4 for column one and Q5 and Q6 for column j. A single sense latch 12 for the array is connected to the ORed pairs of bit lines at array output 14 and 16. The output of the bistable sense latch 12 are at 18 and 20. Each cell includes a pair of programmable thresholds, switchable resistive elements which switch from a high resistance state to a low resistance state when a voltage above its threshold is applied thereacross. Each of the resistive elements per cell is connected to a respective bit line. As illustrated in the FIGURE, the programmable threshold, switchable resistive element may be amorphous memory elements A1 and A2 connected to the word select line by an isolation device which is illustrated as NPN bipolar transistor Q1 and Q2 in an emitter follower configuration. Although the NPN bipolar transistor and the emitter follower configuration is the preferred embodiment, other type of isolation devices including other bipolar transistors as well as diodes may be used.

The sense latch 12 is illustrated as including insulated gate field effect transistors Q7 through Q12 connected as a bistable flip flop. The gates of transistors Q9 and Q10 are connected to the ORed bit lines or array output 14 and 16 respectively. The output terminals of 18 and 20 of sense latch 12 are connected between the junction of transistors Q9 and Q11 and the junction of transistors Q10 and Q12 respectively. The sense latch 12 illustrates an example of one of many flip flops or sense latches which may be used with the present invention which is not considered to be limited to the specific sense latch.

Also connected to the pair of ORed bit lines 14 and 16 are two pairs of current sources. Current sources Q13 and Q14 are connected to bit line 14 and current sources Q15 and Q16 are connected to bit line 16. The geometry of the insulated gate field effect transistors Q14 and Q16 are such as to produce a first current I 1 and the geometry of insulative gate field effect transistors Q13 and Q15 is such to produce a current value I 2 wherein the current I 2 is substantially greater than I 1. These current sources Q13 through Q16 are to program the thresholds of the amorphous elements of the cell and to determine the logic state therein.

Before describing the read and write operation of the present circuit, and as a matter of convenience, a logic zero will be defined as the amorphous element A1 having a lower threshold than the amorphous element A 2 and a logic one will be defined as the amorphous element A 1 having a higher threshold than amorphous element A 2. It should be noted that the amorphous memory elements are those described in the referenced co-pending Neale application and the elements are operated in a high resistive region wherein logic states are produced by variance in threshold and not programming from a non-volatile high to a non-volatile low resistive state. This requirement provides the appropriate speed and reading and writing operation needed for RAM operation. Also, as discussed in the Neale application, by varying the threshold of the amorphous elements, they become non-volatile logic states.

To illustrate the read operation, it will be assumed that $C_{11}$ is a logic zero, i.e. A1 has a lower threshold than A2. A ramp potential is applied across the amorphous devices A 1 and A 2 of cell $C_{11}$ by providing for example a square wave pulse to the bit select line activating transistors Q3 and Q4 and by providing a ramp voltage to the word select line for transistors Q 1 and Q 2. When the ramp potential on the word select line exceeds the threshold of the lower threshold device A 1, A 1 fires and switches from a high to a low resistance state thereby increasing the voltage at 14 which is one of the inputs to the sense latch 12. Prior to the firing of amorphous device A 1, transistors Q7 and Q8 are activated by Chip Enable Signal CE which in turn activate the transistors Q11 and Q12. The increase voltage 14, which is connected to the gate of Q9, activates Q9. This causes the gate of Q12 to be substantially tied to ground and Q12 begins to turn off. As the ramp word select voltage continues to increase to above the threshold of amorphous element A2, it fires and switches from a high to a low resistance state thereby increasing the voltage at 16. Since Q 12 is already beginning to turn off because of the prior firing of A 1, the increased voltage at 16, which is at the gate of Q10, will not affect the regenerative effect of the sense latch 12. With Q 11 activated, output 18 is in a low state and with Q10 activated and Q 12 deactivated, output 20 is in a high state. If the threshold of the amorphous element A 1 is higher than amorphous element A 2, A 2 will fire first and the latch will operate in the reverse manner causing output 18 to have a high state and output 20 to have a low state.

The write operation will be illustrated to write a logic zero state in cell $C_{11}$, e.g. A 1 having a lower threshold value than A 2. The write operation is begun by the selection of cell $C_{11}$ by applying a square wave or pulse to the word select line to activate transistors Q1 and Q 2 and a square wave to the select bit line for cell $C_{11}$. Current source Q 14 is selected to cause a first current I 1 to flow through amorphous device A 1 via the ORed bit line 14. The current I 1 is sufficiently low to lower the threshold of A 1. To assure that the threshold of A 2 is at a high threshold voltage, current source Q 15 is selected to produce a current I 2 through amorphous element A 2 via the ORed bit line 16. The current I 2 is greater than I 1 and is sufficiently high to reset A 2 to its high threshold value if it has previously been at a low threshold state and to maintain it in a high threshold state if it was at the high threshold state. The write currents have a duration sufficiently short to qualify as a RAM, for example 100 nanoseconds. The current is sufficiently low and the duration is sufficiently short to lower the threshold by partial crystalization of the amorphous material without forming a current path which would represent a permanent or non-volatile low resistive state. The current I 2 is sufficiently high to erase the partial crystallization if the amorphous element was previously in a low threshold state. By providing the two current sources to produce current I 1 and I 2, a differential between the threshold of amorphous devices A 1 and A 2 of a selected cell is established. It is not important what the exact threshold voltage is or the exact difference, as long as there is a difference. To store or write a logic 1 state into cell $D_{11}$, current source Q 13 is used to provide a current I 2 through amorphous device A 1 to establish a higher threshold voltage than that established by current source Q 16 which provides current I 1 through the amorphous element A 2.

As discussed previously other types of variable threshold switchable resistive elements may be used. An example is a variable threshold field effect transistor described in the Lincoln patent discussed in the background of the invention. The same reading technique of the present application described for amorphous elements may be used. The programming would require creating a voltage differential across the variable threshold effect transistor instead of the current sources described for the amorphous elements. Amorphous memory elements and variable threshold field effect transistors are but two examples of programmable threshold, switchable resistive elements which may be used with the present scheme.

From the preceeding description of the preferred embodiments, it is evident that the objects of the invention are attained in that a reading and writing scheme for a variable threshold, switchable resistive memory elements insensitive to threshold value is provided using a pair of switchable resistive elements per cell. Although the invention has been described and illustrated in detail, it is to be clearly understood that the same is by way of illustration and example only it is not to be taken by way of limitation. The spirit and scope of this invention is to be limited only by the terms of the appended claims.

What is claimed:

1. In a memory array having a plurality of memory cells, word means for selecting a row of said array, a pair of bit lines per column, bit means for selecting a column of said array, and sensing means connected to said pair of bits line for sensing the electrical state of said pair of bit lines, the improvement comprising:
each cell including a pair of threshold means each switchable from a high resistance state to a low resistance state when a potential above its threshold is applied, each threshold means is connected to a respective bit line for the cell and have a different threshold; and
said sensing means including a bistable latch means for latching in one of two states in response to which threshold means switches first when a cell is selected by a ramp potential.

2. The memory array according to claim 1 wherein said threshold means have programmable thresholds and including programming means connected to said pair of bit lines for defining a first logic state by programming the thresholds of one of the thresholds means higher than the other threshold means and a second logic state by programming the threshold of the one threshold means lower than the other threshold means.

3. The memory array according to claim 1 wherein said array includes only one sensing means and all of said pairs of bit lines are connected to said one sensing means.

4. The memory array according to claim 1 wherein each of said threshold means includes an amorphous element switchable between said high and low resistance state, and means interconnecting said amorphous element and said word select means to isolate said amorphous element when not selected.

5. In a memory array having a plurality of memory cells, word means for selecting a row of said array, a pair of bit lines per column, bit means for selecting a column of said array, and sensing means connected to said pair of bit lines for sensing the electrical state of said pair of bit lines, the improvement comprising:
each cell including a pair of threshold means connected to a respective bit line and each switchable from a high resistance state to a low resistance state when a potential above its threshold is applied, and a pair of bipolar transistors each connecting a respective threshold means to said word means; and
said sensing means includes a bistable latch means including insulated gate field effect transistors for latching in one of two states in response to which threshold means switches first when a cell is selected by a ramp potential.

6. The memory array according to claim 5 wherein said threshold means have programmable thresholds and including a pair of insulated gate field effect transistor current sources means connected to said pair of bit lines for providing different current levels in each bit line to program the thresholds of the two threshold means for a selected cell to define a first and second polarity of threshold differentials between the threshold means.

7. The memory array according to claim 5 wherein said threshold means are amorphous elements and said bipolar transistors are NPN transistors in an emitter follower configuration with the base connected to the word means and the amorphous elements connected to the emitters.

8. A method of reading the logic state of a cell of a memory array having a plurality of cells each of which includes a pair of threshold means switchable from a high to a low resistance state when a potential above its threshold is applied comprising:
selecting a cell by applying a ramp potential across the pair of threshold means of the cell;
monitoring the resistance state of both threshold means to determine which changed state first; and
indicating logic state of the selected cell as a function of which threshold means of the pair changed state first.

9. A method of writing logic state into a cell of a memory array having a plurality of cells each of which includes a pair of threshold means switchable from a high to a low resistance state when a potential above its threshold is applied comprising:
selecting a cell by applying a potential above the threshold of both threshold means across the pair of threshold means of a cell;
applying a first current through one of said threshold means to define a first threshold; and
applying a second current through the other of said threshold means to define a second threshold, whereby the logic state is defined by which threshold means has the highest threshold.

10. The method of writing according to claim 9 wherein said first current is sufficiently small to lower the threshold value of the threshold means and said second current is sufficiently large to reset a threshold means to a high threshold value if it was previously in a low threshold value.

11. The method of writing according to claim 10 wherein said threshold means are amorphous elements and said currents are selected to program the threshold within the high resistance state of the amorphous elements.

* * * * *

UNITED STATES PATENT AND TRADEMARK OFFICE
CERTIFICATE OF CORRECTION

PATENT NO. :   4,236,231                    Page 1 of 2
DATED      :   November 25, 1980
INVENTOR(S):   David L. Taylor It is certified that error appears in the above-identified patent and that said Letters Patent are hereby corrected as shown below:

Column 1, line 27, insert a period (.) after the letter "G".

Column 1, line 27, delete "Non-Volitile" and insert therefor --Non-Volatile--.

Column 1, line 48, delete "sate" and insert therefor --state--.

Column 2, line 14, delete "which" and insert therefor --the--.

Column 5, line 1, delete "crystalization" and insert therefor --crystallization--.

Column 5, line 5, delete "crystalization" and insert therefor --crystallization--.

Column 5, line 12, delete "$D_{11}$" and insert therefor --$C_{11}$--.

UNITED STATES PATENT AND TRADEMARK OFFICE
CERTIFICATE OF CORRECTION

PATENT NO. : 4,236,231
DATED : November 25, 1980
INVENTOR(S) : David L. Taylor

It is certified that error appears in the above-identified patent and that said Letters Patent are hereby corrected as shown below:

Column 5, line 32, delete "preceeding" and insert therefor --preceding--.

Column 5, line 40, delete "it" and insert therefor --and--.

Column 6, line 55, after the word "writing" insert --a--.

Signed and Sealed this

Tenth Day of March 1981

[SEAL]

Attest:

RENE D. TEGTMEYER

*Attesting Officer*  *Acting Commissioner of Patents and Trademarks*